United States Patent [19]

Hoenig

[11] Patent Number: 4,804,915
[45] Date of Patent: Feb. 14, 1989

[54] SQUID MAGNETOMETER INCLUDING A FLUX-GATE CHOPPER USING A MECHANICALLY VIBRATING SUPERCONDUCTING MIRROR

[75] Inventor: Eckhardt Hoenig, Erlangen, Fed. Rep. of Germany

[73] Assignee: Siemens Aktiengesellschaft, Berlin and Munich, Fed. Rep. of Germany

[21] Appl. No.: 151,432

[22] Filed: Feb. 2, 1988

[30] Foreign Application Priority Data

Feb. 16, 1987 [DE] Fed. Rep. of Germany ....... 3704834

[51] Int. Cl.$^4$ ............................................. G01R 33/35
[52] U.S. Cl. .................................... 324/248; 324/259
[58] Field of Search ................ 324/248, 249, 256, 259

[56] References Cited

U.S. PATENT DOCUMENTS 3,184,674 5/1965 Garwin .
3,454,875 7/1969 Bol et al. .

FOREIGN PATENT DOCUMENTS 0212452 3/1987 European Pat. Off. .
0174866 4/1982 Japan .................................. 324/248
0169070 10/1983 Japan .................................. 324/248

OTHER PUBLICATIONS

Csepregi: "Micromechanics: A Silicon Microfabrication Technology", 3 Microelectronic Engineering, (1985), pp. 221-234.
Koch: "Flicker (1/f) Noise Tunnel Junction DC-Squids", Journal of Low Temperature Physics, vol. 15, Nos. 1/2, 1983.
Davis: "Squid Magnotometers for Submarine Communications at Extremely Low Frequencies", Proc. Int. Conf. on Supercond. Quantum Devices, Berlin 1986.
Ketchen: "Ultra-Low-Noise Tunnel Junction dc SQUID With A Tightly Coupled Planar Input Coil", Appl. Phys. Lett., vol. 40, No. 8, Apr. 15, 1982.
Bleaney and Bleaney, Electricity and Magnetism 3rd Ed., 1976, p. 187.
Foglietti: "Low-Frequency Noise in Low 1/f Noise DC SQUID's", Appl. Phys. Lett., vol. 49, No. 20, Nov. 17, 1986, pp. 1393-1395.
Moody: "Preliminary Tests of a Newly Developed Superconducting Gravity Gravitometer", IEEE Transactions on Magnetics, vol. MAG-19, No. 3, May 1983, pp. 461-468.
Jaycox: "Planar Cooupling Scheme for Ultra Low Noise DC Squid's," IEEE Transactions on Magnetics, vol. MAG-17, No. 1, Jan. 1981, pp. 400-403.
Tesche: "Design of Compensated Planar Input Coils for Biomagnetic Measurements", SQUID '85, Walter De Greyter & Co., 1985.
Muhlfelder: "Double Transformer Coupling to A Very Low Noise Squid", IEEE Transactions on Magnetics, vol. MAG-19, No. 3, May 1983, pp. 303-307.

Primary Examiner—Reinhard J. Eisenzopf
Assistant Examiner—Jose M. Solis
Attorney, Agent, or Firm—Kenyon & Kenyon

[57] ABSTRACT

An apparatus for measuring magnetic fields that change at extremely low frequency contains a SQUID magnetometer having a super-conducting flux transformer for inductively coupling the measuring signal into a direct current SQUID sensor. Quasi-static magnetic fields that have frequencies far below 1 Hz are detected. The flux transformer has two inductively coupled windings. At least one winding is arranged on a first carrier element (chip) that enclose a common coupling hole. A second carrier element (counter chip) is attached to the first carrier element. A super-conducting oscillating diaphragm is positioned opposite the coupling hole. The mutual inductance of the windings is modulated with this super-conducting vibrating diaphragm through appropriate changes of the effective size of the coupling hole with a frequency that lies in a characteristic frequency range for low-level noise operation of the SQUID.

10 Claims, 2 Drawing Sheets

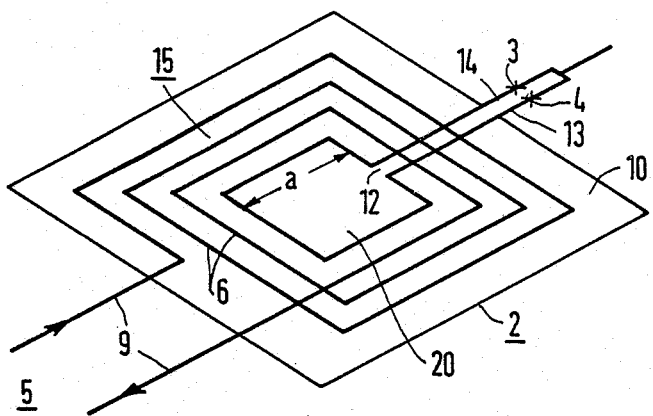
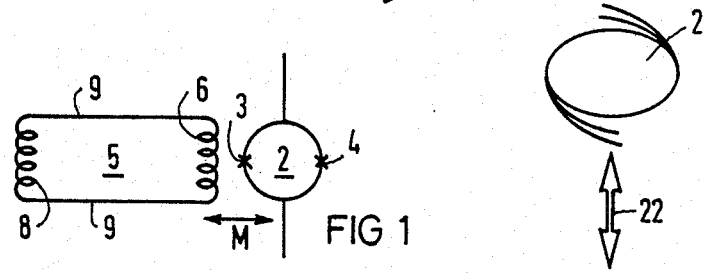
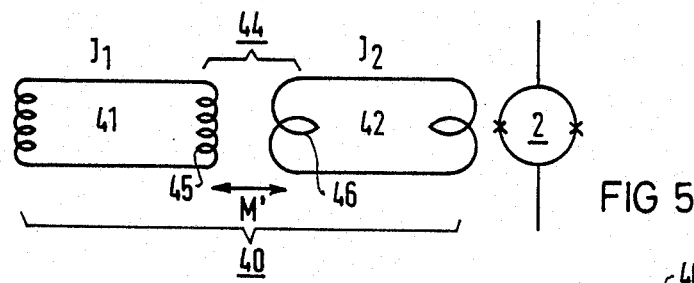
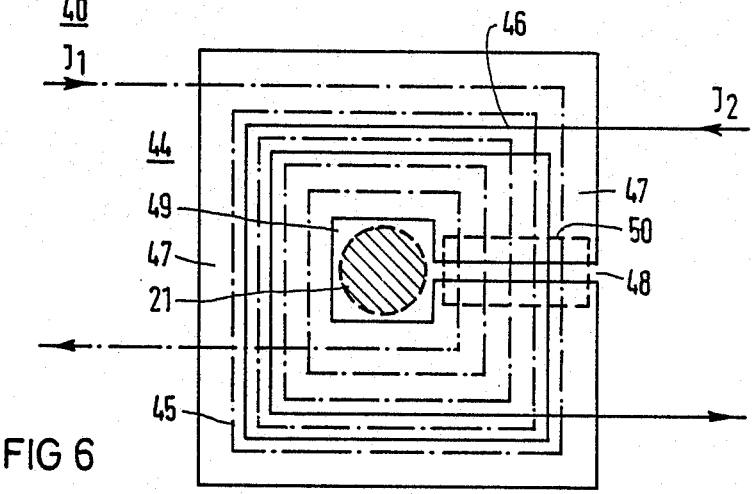

SQUID MAGNETOMETER INCLUDING A FLUX-GATE CHOPPER USING A MECHANICALLY VIBRATING SUPERCONDUCTING MIRROR

BACKGROUND OF THE INVENTION

1. Field of the Invention.

The present invention relates to an apparatus for measuring magnetic fields that change at extreme low frequency using a SQUID magnetometer that has a superconducting flux transformer for inductively coupling a measuring signal into a sensor with a direct current SQUID and that contains a device for modulating the measuring signal.

2. Description of the Related Art.

SQUID (super-conducting quantum interferometer) magnetometers can be built with high magnetic field sensitivity, for example, on the order to magnitude of $10^{-14}$ Tesla x (Hertz)$^{-\frac{1}{2}}$. A suitable magnetometer generally contains a SQUID sensor and a flux transformer for indirectly coupling the magnetic field to be detected into the SQUID sensor.

The so-called 1/f noise determines the outermost limit of sensitivity for this type of magnetometer. This limit is also inversely proportional to frequency (cf. for example "Journal of Low Temperature Physics", Vol. 51, Nos. $\frac{1}{2}$, 1983, pages 207 to 224).

The publication "SQUID Superconducting Quantum Interference Devices and their Applications" (Proc. Int. Conf. on Supercond. Quantum Devices, Berlin 1976), 1977, pages 439 to 484, describes an apparatus for underwater communication. This device can also detect magnetic fields with extremely low frequencies from 30 to 3000 Hz. This device, inter alia, has a RF-SQUID as sensor. The sensor is located together with a super-conducting flux transformer in a cryostat (cf. page 449, FIG. 3). This flux transformer comprises a field coil that serves as an antenna, also called a detection loop, which is connected with a coupling coil to couple the measuring signal into the SQUID. These superconducting parts of the device can be developed, in particular, as thin-film structures. The super-conducting part of the device comprising the flux transformer and the SQUID sensor is connected with low noise level electronics connected downstream.

It is known that the level of noise can be further lowered by applying direct current (D) SQUIDS to such measuring devices (cf. for example "Applied Physics Letters", Vol. 40, No. 8, Apr. 15, 1982, pages 736 to 738).

However very small quasi-static magnetic fields that have frequencies of, for example, 0.01 Hz require measuring times in the range of a second and cannot be measured with known devices with sufficient sensitivity because of the 1/f noise of the SQUID sensor begins below approximately 1 Hz. This situation is particularly true for fields from remote sources that cannot be influenced, for example by modulation, and are not homogeneous. Then magnetometers can be used in a known manner by generating a modulation signal through vibration of a detection coil. The modulation can also be effected in an analogous manner through motion of a magnetizable sample relative to a detection coil (cf. for example the book by B.I. Bleaney and B. Bleaney: "Electricity and Magnetism", 3rd edition, 1976, page 187). The extremely low frequency range mentioned above requires that the characteristic length of the field variation must larger than the dimensions of the SQUID sensor or the coolant container surrounding it. Moreover, a sufficiently low flux noise cannot be achieved with the ferromagnetic material provided for a moving sample.

Electronic circuit measures are known for lowering the minimum measuring frequency limit of the 1/f noise of a DC-SQUID. See "Applied Physics Letters", Vol. 49, No. 20, Nov. 17, 1986, pages 1393 to 1395. These measures, however, only suppress the noise component caused by fluctuations of the critical current of the DC-SQUID. The noise components corresponding to magnetic flux noise cannot be diminished through application of the known circuit measures.

SUMMARY OF THE INVENTION

The present invention develops the initially mentioned measuring apparatus to detect quasi-static magnetic fields having frequencies far below approximately 1 Hz, in particular below 0.1 Hz, with the high magnetic field sensitivity typical for SQUID magnetometers. The noise components from magnetic flux noise are reduced.

The flux transformer of the present invention modulates the signal received with the detection coil or loop of the flux transformer to produce what is also referred to as effect modulation. The modulation has the advantage that the measuring frequency can be shifted into a working range of the SQUID that has a low-level of operational noise. This frequency range lies, in general, above 1 Hz. The corresponding measures for modulation extend to the mutual inductance of the two windings of a part of the measuring device referred to as transformer element. This transformer element can be integrated into the flux transformer. Alternately, only one winding called coupling coil counts as part of the flux transformer while the second winding is part of a loop of the SQUID sensor.

BRIEF DESCRIPTION OF THE DRAWINGS

FIG. 1 shows a wiring diagram for a modulation device of a measuring device according to the present invention;

FIG. 2 shows an appropriate modulation device;

FIGS. 5 and 6 show a further embodiment of a modulation device.

DETAILED DESCRIPTION

Figure 3:
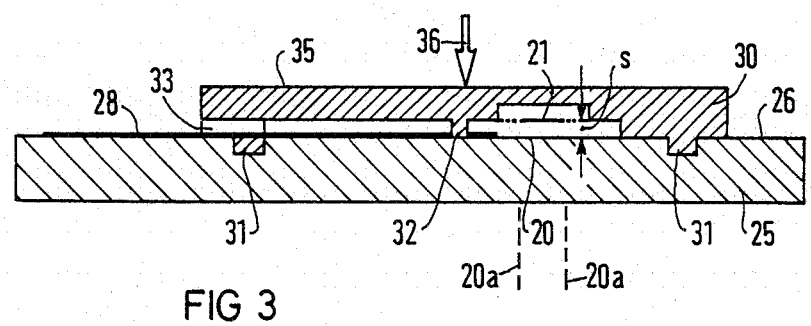
FIG. 3 shows a cross-section through the modulation device shown in FIG. 2.

According to the circuit diagram in FIG. 1, the measuring device according to the present invention contains a direct current (DC) SQUID 2 with two Josephson tunnel elements 3 and 4. A super-conducting flux transformer 5 is inductively coupled to the SQUID over a winding also called coupling coil 6. The flux transformer 5 contains at least one further winding, referred to as detection or sensor loop 8, in addition to the coupling coil for receiving the magnetic field to be measured. This loop is connected to the coupling coil 6 through super-conducting connecting conductors 9. Currents in the flux transformer are brought to zero before beginning the actual measurement in known manner such as, for example, with heat pulses supplied over light wave guides. The current can also be removed from the flux transformer through specific inverse feedback. Furthermore, constant background fields and interference fields in the environment generally must be compensated for.

As is further apparent from the circuit diagram of FIG. 1, the present invention provides for modulating the mutual inductance M between super-conducting flux transformer 5 and the SQUID 2. In contrast to gravitational wave detectors (cf. for example "IEEE Transactions on Magnetics", Vol. MAG-19, No. 3, May 1983, Pages 461 to 468), in which the mutual inductance changes with a moved testing mass, the present invention brings the current in the flux transformer to zero before beginning the measurements. Then only the small changes of the field to be measured lead to currents in the flux transformer. The effect of these currents is that the SQUID is modulated as desired. This modulation must take place with such frequency that the measuring signal is shifted into a frequency range of the SQUID so that low noise operation is ensured. Appropriate modulation frequencies generally lie above 1 Hz, for example above 100 Hz, and preferably above 1 kHz.

To keep the so-called "flux transfer" of the flux transformer 5 as high as possible, the circuit according to FIG. 1 advantageously uses a DC-SQUID. This embodiment is shown in FIG. 2 in cross section. The SQUID and parts of the flux transformer 5 assigned to it are built using a thin-film technique (cf. "IEEE Transactions on Magnetics", Vol. MAG-17, No. 1, January 1981, pages 400 to 403). The SQUID 2 has a wide annular loop 10 of super-conducting material that is interrupted on one side by a small gap or slit 12 at the ends. This gap may comprise two narrow conductor paths 13 and 14 leading toward the outside. The gap is best closed with a special covering, not shown, or by overlapping the two conductor paths to optimize the flux coupling into the SQUID and to minimize the loss in gap 12. The two Josephson tunnel elments 3 and 4, characteristic of a DC SQUID, are developed in the region of the conductor paths 13 and 14 leading toward the outside. On the annular loop 10, furthermore, are located the windings of the flat coupling coil 6 of the flux transformer 5. Loop 10 and coupling coil 6, therefore, form the two windings of a transformer element 15 that is known per se.

The annular loop 10 of the DC-SQUID 2 encloses a small, for example, circular or square coupling hole 20 having a lateral extent a of, for example, approximately 50 $\mu$m. The present invention modulates the coupling hole and thereby the mutual inductance of the transformer element 15. The modulation is accomplished using a super-conduction vibrating mirror which has an oscillating diaphragm 21 coated with a super-conducting material. The super-conducting material should consist of a substance having critical temperature that is lower than that of the material of the flux transformer 5. In this manner can it be ensured that currents occurring there before the actual measurement are made can be brought to zero through controlled heating or can be frozen in. The oscillating diaphragm 21, which is moved, for example, magnetically, piezoelectrically, acoustically, or mechanically, is arranged only a few micrometers away from the thin-film structure of the SQUID 2 or of the annular loop 10. As is indicated by double arrow 22, this oscillating diaphragm closes the coupling hole 20 with approximately the predetermined modulation frequency.

The formation of the modulation device indicated in FIG. 2 can be seen in greater detail in the schematic cross section of FIG. 3. A chip 25 formed from silicon serves as a first carrier element for the entire DC-SQUID and advantageously at least also for the coupling coil of the flux transformer. The range of the coupling hole 20 on the upper flat side 26 of chip 25 is indicated by dashed lines. On flat side 26 are additional, discrete super-conducting conductor paths for the coupling coil and the SQUID. These paths are illustrated by a heavy line 28.

Chip 25 is connected with a so-called counter chip 30. An etched fitting structures 31 in chip 25 and the counter chip 30 as well as webs 32 provide a secure fit. Counter chip 30 has recesses 33 in the appropriate places to avoid damage of the discrete conductor paths 28 upon contact. The back side of the counter chip 30 is coated with a super-conducting plane, a so-called "ground plane" 35. The counter chip 30 can be pressed with a pressure force acting upon plane 35 from the backside of the chip 25 as indicated in the figure with arrow 36.

The embodiment shown in FIG. 3 assumes that special recesses 33 must be provided in the counter chip 30 to protect against damage of the discrete conductor paths 28. This can be equally well ensured with special spacer elements between the two chips 25 and 30. Further, chips 25 and 30 also do not necessarily need to be held by pressure force. Chips 25 and 30 could be laminated or cemented together.

Figure 4:
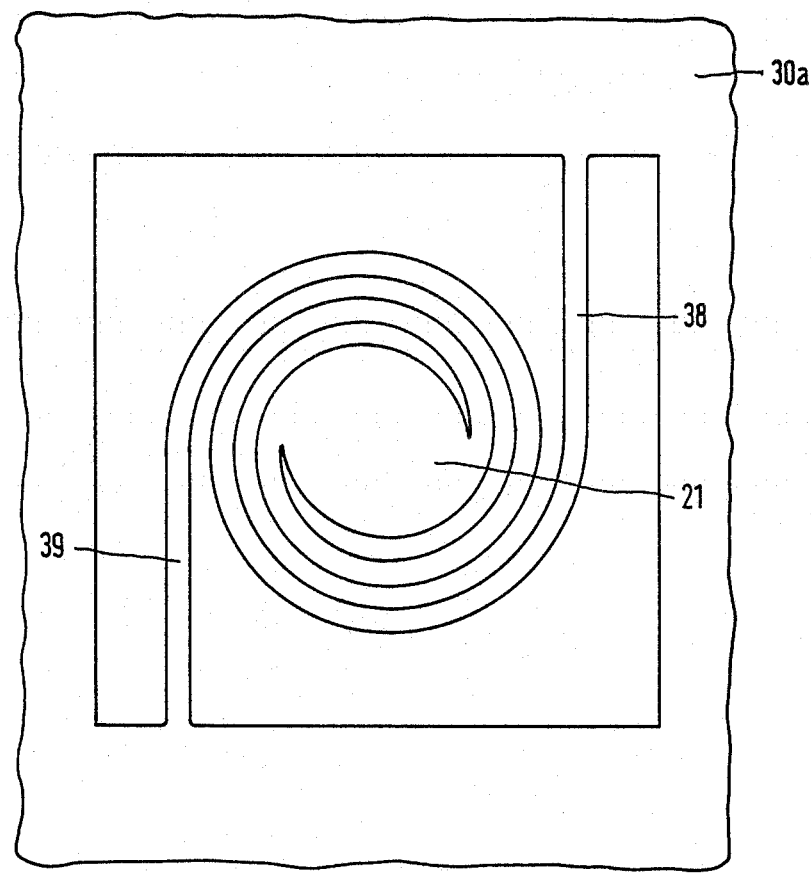
FIG. 4 shows an oscillating diaphragm of the modulation device.

According to the present invention the counter chip 30 has an oscillating diaphragm 21 arranged at a safe distance s of a few micrometers exactly opposite the coupling hole 20 on chip 25. This oscillating diaphragm is illustrated in a top view in FIG. 4. It is best if the diaphragm is produced as a monocrystalline silicon chip (Si-wafer) in a process referred to as "micromechanics". This process is extensively described in the publication "Microelectric Engineering", Vol. 3, 1985, pages 221 to 234. This process utilizes highly refined photolithography and etching technology to prepare complicated structures of silicon in the micrometer range. As shown, oscillating diaphragm 21 is held by highly elastic spiral parts 38 and 39 to form a structure of high mechanical quality. Its thickness is only a few micrometers. The diaphragm is reproduced in FIG. 4 as section 30a of a Si-chip serving as counter chip 30 and is enlarged considerably with respect to FIG. 3. A silicon resonator is built with this oscillating diaphragm 21 which is coated with the super-conducting material on its front side facing the coupling hole 20.

Excitation of the oscillations of the resonator are developed a the predetermined modulation frequency using a suitable planar exciter coil within the coupling hole 20 on chip 25. This exciter coil is best built in the form of a gradiometer of two partial coils that are mutually compensating (cf. for example the publication "SQUID '85" (Publisher W. D. Gruyter, 1985), paper by C. D. Tesche: "Design of compensated planar input coils for biomagnetic measurements"). The leads for this primary coil are here led out of the region of the transformer element to the outside as strip lines or on superconducting ground planes. Chip 25 may additionally comprise a special feedback winding to reduce higher order crosstalk from the resonator exciter field not present in a first approximation.

Rather than the kind of mutual inductance modulation suggested in conjunction with FIGS. 1 to 3, the flux transformer could be divided into two stages in a known manner (cf., for example, "IEEE Transactions on Magnetics", Vol. MAG-19, No. 3, 1983, pages 303 to 307). A corresponding circuit diagram is shown in FIG. 5. The flux transformer there labeled 40 consequently contains two loop-like stages 41 and 42 that are electrically closed within themselves. Each stage represents essentially discrete flux transformers having currents $I_1$ and $I_2$. Coupling between these stages with a mutual inductance M' takes place through a transformer element 44 (cf., for example U.S. Pat. No. 3,184,674) known as flat coil transformer. The transformer windings of this transformer element 44 are assigned to stages 41 and 42 and labeled 45 and 46 in the figure.

The transformer element 44 is schematically shown in a front view in greater detail in FIG. 6. It contains two integrated thin-film windings 45 and 46, illustrated by a dashed line and a solid line, respectively, These windings are applied together and superimposed on each other on a slit ring 47 having an overlapping covered slit 48 and coupling hole 49, respectively. The slit covering labeled 50 is indicated by a dashed line. Consequently, this transformer element 44 corresponds largely to the transformer element 15 shown in FIGS. 1 and 2 despite the absence of Josephson elements from ring 47. As in the embodiment shown in FIG. 2, modulation of the effective size of the coupling hole 49 is carried out with a super-conducting oscillating diaphragm 21. The oscillating diaphragm 21 is part of a counter chip that is placed on a chip, which, inter alia, carries the coupling transformer element 44 shown in FIG. 6. The part of the coupling hole 49 geometrically covered by the vibrating diaphragm is illustrated with hatching. Before beginning the measurements, the two currents $I_1$ and $I_2$ are nulled in the thin-film windings 45 and 46, respectively, in the manner described. A conventional carrier frequency process for reading out the SQUID signals can be used in the modulation as indicated in FIGS. 5 and 6.

In the embodiments shown it was assumed that transformer element 15 or 44, which encloses the coupling hole 20 respectively 49, is located entirely on the chip 25 carrying the SQUID 2. Under certain circumstances, however, it is also possible to arrange parts of the transformer element, such as coupling coil 6 of the transformer element 15, on the counter chip 30.

What is claimed is:

1. An apparatus for measuring low frequncy magnetic fields with a SQUID magnetometer having a super-conducting flux transformer for coupling measurement signals into a sensor comprising a direct current SQUID, comprising:

a flux transformer element being associated with at least first and second inductively coupled windings of the super-conducting flux transformer, the inductively coupled windings enclosing a common coupling hole;

a first carrier element for supporting at least one of the inductively coupled windings;

a second carrier element attached to the first carrier element;

said second carrier element comprising
a super-conducting oscillating mirror having an oscillating diaphragm coated with super-conducting material attached to the second carrier element; and
means for changing an effective size of the coupling hole and thereby a mutual inductance of the coupled windings by means of the super-conducting vibrating mirror at a modulation frequency lying in a low-level noise frequency range that is characteristic of the SQUID.

2. An apparatus as claimed in claim 1, wherein the flux transformer comprises two discrete stages forming smaller flux transformers that are inductively coupled over the windings of the transformer element.

3. An apparatus as claimed in claim 1, wherein:
the first winding is a coupling coil of the flux transformer; and
the second winding comprises a loop of the SQUID.

4. An apparatus as claimed in claim 1, wherein the modulation frequency is greater than 1 Hz.

5. An apparatus as claimed in claim 4, wherein the modulation frequency is greater than 100 Hz.

6. An apparatus as claimed in claim 1, wherein the second carrier element comprises monocrystalline silicon.

7. An apparatus as claimed in claim 6, wherein the oscillating diaphragm comprises a microstructure of the second carrier element.

8. An apparatus as claimed in claim 1, wherein the oscillating diaphragm comprises a deposited super-conducting material that has a lower critical temperature than the super-conducting material of the flux transformer.

9. An apparatus as claimed in claim 1 further comprising a planar exciter coil positioned within the coupling hole to form a gradiometer from two mutually compensating partial coils to oscillate the oscillating diaphragm.

10. An apparatus as claimed in claim 1, wherein:
the first winding of the transformer element is positioned on the first carrier element; and
the second winding of the transformer element is located on the second carrier element.

* * * * *